Figure 1A:
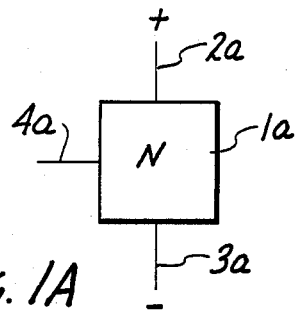

United States Patent [19]

Spek

[11] Patent Number: 4,823,025

[45] Date of Patent: Apr. 18, 1989

[54] ELECTRONIC CIRCUIT ELEMENT WITH FIELD-EFFECT TRANSISTOR OPERATION APPLICATIONS OF THIS CIRCUIT ELEMENT, AND SUBSTITUTION CIRCUIT FOR SUCH AN ELEMENT

[76] Inventor: Johan D. Spek, Reinickendorfer Strasse 64, 4933 Blomberg, Fed. Rep. of Germany

[21] Appl. No.: 30,848

[22] PCT Filed: Jun. 24, 1986

[86] PCT No.: PCT/NL86/00017

§ 371 Date: Apr. 6, 1987

§ 102(e) Date: Apr. 6, 1987

[87] PCT Pub. No.: WO87/00367

PCT Pub. Date: Jan. 15, 1987

[30] Foreign Application Priority Data

Jun. 24, 1985 [NL] Netherlands .......................... 8501816

[51] Int. Cl.[4] .................. H03K 3/353; H03K 17/687; H03K 19/094; G11C 11/34
[52] U.S. Cl. ..................................... 307/304; 307/571; 307/573; 307/575; 307/576; 307/584; 307/585; 307/450; 307/451; 365/182
[58] Field of Search ............... 307/304, 473, 571, 573, 307/575, 576, 577, 579, 584, 585, 450, 451; 365/182

[56] References Cited

U.S. PATENT DOCUMENTS

| | | | |
|---|---|---|---|
| 3,886,464 | 5/1975 | Dingwall | 307/304 |
| 4,074,151 | 2/1978 | Buckley, III et al. | 307/304 |
| 4,663,547 | 5/1987 | Baliga et al. | 307/304 |

FOREIGN PATENT DOCUMENTS 0741473 6/1980 U.S.S.R. ............................. 307/571

Primary Examiner—Stanley D. Miller
Assistant Examiner—Trong Quang Phan
Attorney, Agent, or Firm—Beehler, Pavitt, Siegemund, Jagger, Martella & Dawes

[57] ABSTRACT

An electronic circuit element with field-effect operation and with such characteristics that its source terminal (2) is to be connected, in the case of an N-type element (1a) to the positive, and in the case of a P-type element (1b) to the negative pole of a current source, said element (1) being non-conducting if its gate terminal is at the voltage of the pole connected with the drain terminal (3). This element (1) can be used as a memory circuit, for forming a trivalent switching circuit, and as an analogue amplifier with a negative resistance characteristic. Such an element (1) can be assembled from a series connection of an n-type and a p-type field-effect transistor (11a, 11b) having their source electrodes (12) interconnected, the gate terminal (4) being formed by the gate electrode (14) of the n-type or p-type transistor (11a, 11b) resp., the gate electrode (14) of the other transistor being connected with the drain electrode (13) of the first one.

8 Claims, 2 Drawing Sheets

ELECTRONIC CIRCUIT ELEMENT WITH FIELD-EFFECT TRANSISTOR OPERATION APPLICATIONS OF THIS CIRCUIT ELEMENT, AND SUBSTITUTION CIRCUIT FOR SUCH AN ELEMENT

The invention relates to a circuit element with field-effect transistor operation, comprising a source and a drain terminal which, with the interposition of a load, are to be connected to the poles of a current source, and a gate terminal to be connected to a control signal source.

The invention provides an element of this kind which is characterised by having such characteristics that the source terminal is to be connected, in the case of an N-type element, to the positive, and in the case of a P-type element to the negative current source pole, which element is non-conducting when the gate terminal is at the voltage of the pole connected to the drain terminal.

Such a circuit element can be used, on the basis of its characteristics, be used in a particularly favourable way for various applications which, up till now, could only be realised by means of larger numbers of transistors.

A first application is as a memory element which, according to the invention, is characterised in that for use as a memory element the drain terminal is connected with the current source pole in question by means of a load resistor, and furthermore, with the control terminal by means of a feed-back resistor, this in such a manner that the voltage fed-back towards the input is always equal to the control voltage which, then, can be removed.

The expressions N- and P-type elements are used here in anology with n- and p-type field-effect transistors, since the voltages between the control and source electrodes have the same polarities in the corresponding cases.

Such a memory element has a particular advantage that by means of feeding back the voltage towards the input the condition is maintained as long as the supply voltage is present, so that an input signal with a short duration is sufficient. Therefore such an element needs not to be refreshed which will lead to a substantial simplification of a memory circuit assembly.

Another application is in a trivalent circuit adapted to be connected between the positive and negative poles of a current source, and to produce in response to an input signal which can be positive, negative or zero, an output signal having a voltage value which substantially corresponds to the voltage of the positive and negative source pole and the intermediate zero volate value respectively. The known circuits for this purpose comprise relatively large numbers of transistors and consume relatively much current, which, in computing networks with large numbers of trivalent stages, can be onerous. A trivalent stage, however, can lead to substantial savings in respect of the usual bivalent stages, if this number and the current consumption might be reduced. According to the invention this can be obtained with a trivalent circuit which is characterised in that it consists of an N-type and a P-type element of the above-mentioned kind, the gate terminals of which are connected with a common input, which elements are connected in series and in opposite senses between the source poles in such a manner that the source terminals there of are connected to the positive and negative poles respectively, and both drain terminals are connected to a common output and to one end of a common feed-back resistor, which resistor, with its other end, is connected to the common input, all this in such a manner that both elements are never simultaneously conducting. The latter condition provides substantial current savings, and such a trivalent circuit can be assembled in a very simple manner from only two memory elements.

This circuit can be connected as a bivalent circuit by connecting one of the current terminals to the zero voltage.

Since at a zero input signal the output voltage can be floating, it is advisable to clamp this voltage by means of an auxiliary circuit formed by two elements of opposite conductivity type connected in series between the output and a zero-voltage terminal, the gate terminal of one element being connected with the output, and that of the other one with the connecting point between those elements, said elements being conducting together only when the output voltage is zero.

A circuit element of the invention has, furthermore, such output current/voltage characteristics, that it can be used as an analogue amplifier with a large amplification factor and without phase shift, its input and output voltages having the same polarity. If the gate terminal is connected in such a manner that the voltage at the gate terminal has the same polarity as and is directly proportional to the voltage at the drain terminal, the circuit element has a constant negative resistance characteristic in the whole voltage range.

This is favourable for, inter alia, dc amplifiers, ac amplifiers without phase shift, and the like.

The field-effect transistors used up till now have the disadvantage that they do not comply with the above-mentioned requirements. As to the supply voltage they can be reversed, but then also the source and drain electrodes change places too so that a control voltage is to be used which, for making the transistor non-conducting, should be more negative or positive respectively than the available supply voltage, which has the result that the feed-back aimed at is not possible.

Although it is possible that such transistors may be developed, it is, for the moment, simpler to replace the circuit element of the invention by a substitute circuit comprising usual field-effect transistors, which is characterised in that it consists of an n-type and a p-type field-effect transistor, the source electrodes of which being interconnected in which, in the case of an N-type element, the gate electrode of the n-type transistor forms the gate terminal, and its drain electrode forms the source electrode of the circuit, and, moreover, the gate electrode of the p-type transistor is connected to the drain electrode of the n-type transistor, and its drain electrode forms the drain terminal of the circuit, whereas in the case of the P-type element the drain electrode of the p-type transistor forms the source terminal, and its gate electrode forms the gate terminal of the circuit, the control electrode of the n-type transistor being connected with the drain electrode of the p-type transistor, and its drain electrode forming the drain terminal of the circuit.

Therefore the circuit element of the invention can be realised with only two field-effect transistors so that, at any rate, the envisaged applications can be realised with a restricted number of transistors.

Figure 1B:
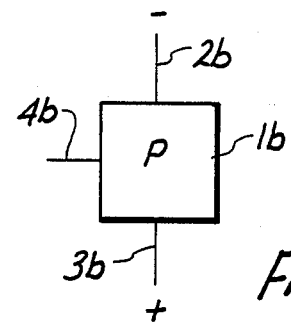
Figure 2A:
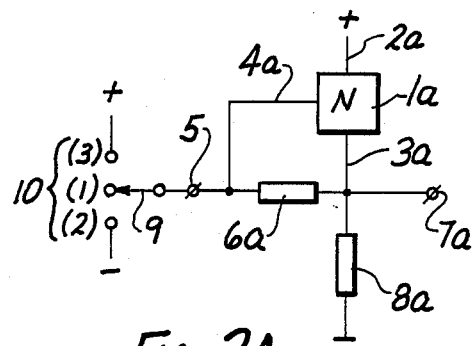
Figure 2B:
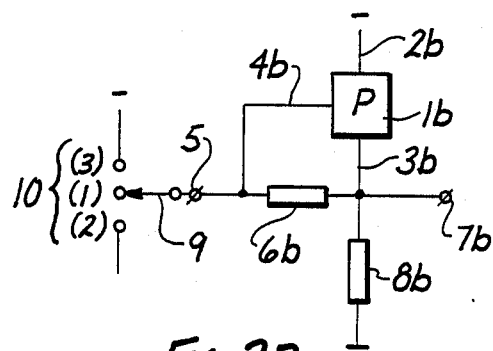
Figure 3:
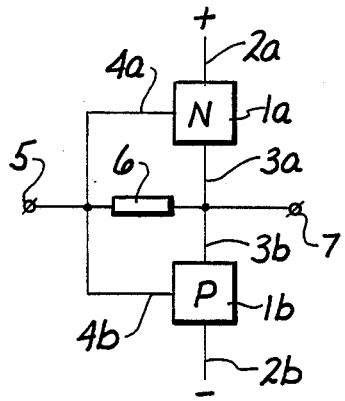
Figure 4:
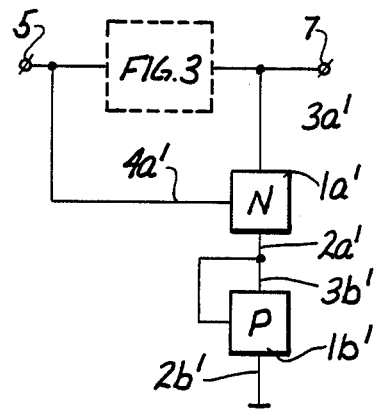
Figure 5:
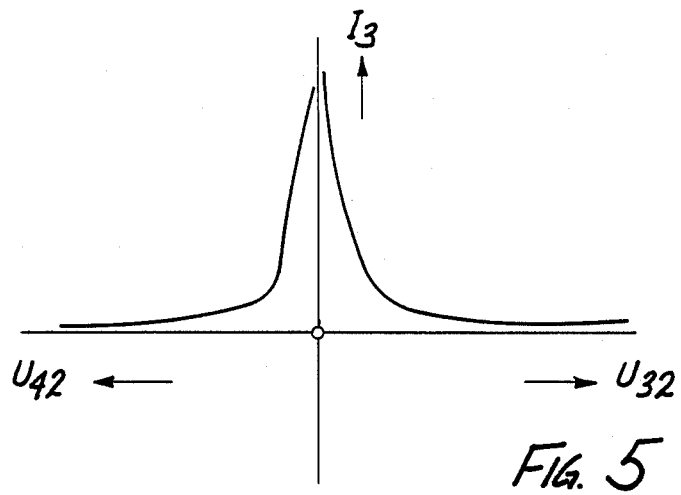
Figure 6A:
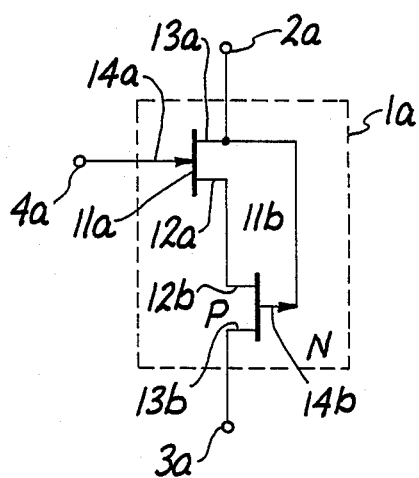

The invention will be elucidated in more detail by reference to the annexed drawing, showing in:

FIGS. 1A and B two circuit elements of the invention in block diagram representation;

FIGS. 2, 3 and 4 block diagrams of applications of said elements;

FIG. 5 a graphic representation of the operation of a particular application of such an element; and FIGS. 6A and B diagrams of a practical embodiment of the elements of FIGS. 1A and 1B resp.

In FIGS. 1A and 1B two circuit elements $1a$ and $1b$ resp. of the invention are shown in principle, which mainly operate as a field-effect transistor, and the terminals thereof will be named, in conformity with what is usual in field-effect transistors, the source terminal $2a$ and $2b$ resp., the drain terminal $3a$ and $3b$ resp., and the gate terminal $4a$ and $4b$ resp. In correspondence with the conductivity type of the semiconductor the element $1a$ will be called an N-type, and the element $1b$ a P-type element. In the case of the element $1a$ and $1b$ resp. the source terminal $2a$ and $2b$ resp. will be connected to the positive or the negative pole resp. of the current source.

The characteristics of these elements are, now, assumed to be so that these elements are non-conducting if the gate terminal 4 is at a voltage corresponding to that of the drain terminal 3. In the case of an N-type element the gate voltage is, then, negative in respect of the source terminal, and positive in the case of a P-element.

These characteristics differ from those of a usual field-effect transistor. For in the latter case the source electrode of an n-type transistor is at a negative voltage, and that of a p-type transistor at a positive voltage, said transistors being non-conducting if the gate voltage in respect of the source electrode is negative or positive respectively.

A normal junction field-effect transistor of the depletion type has a substantially symmetrical structure. If a voltage is applied across the extremities of the channel, that extremity of an n-channel transistor which is negative will act as the source, and in the case of a p-channel transistor the source is formed by the positive extremity. If, now, the polarity is reversed, and, thus, is brought into conformity with the polarity between the gate and source electrodes, the operation of the elements $1a$ and $1b$ is nevertheless not obtained, since by this voltage reversal both extremities of the channel change roles so that, in fact, nothing has changed.

Before describing the structure of an element of FIG. 1, at first some advantageous applications will be considered.

FIGS. 2A and B show the application of the element $1a$ and $1b$ resp. in a bivalent memory unit. As far as the common characteristics of both circuits shown are concerned, the indices a and b of the reference numerals will be omitted in the description thereof.

The gate terminal 4 of the element 1 in question is connected with an input terminal 5 which, moreover, is connected with one end of a feed-back resistor 6. The other end of said feed-back resistor 6 is connected with the drain terminal 3, an output terminal 7 and one end of a load resistor 8. The other end of the load resistor 8 is connected to ground, i.e. one pole of the supply source.

For elucidating the operation of the memory units of FIG. 2, it will be assumed that the input terminal is connected with a 3-position switch 9 having a floating mid-point contact 10(1), the other contacts 10(2) and 10(3) being connected to ground and the other pole of the supply source respectively. When the switch 9 is moved towards the contact 10(2), the element 1 becomes non-conducting if it had not been so before. The drain 3 has, then, the ground voltage which, by means of the resistor 6, is fed-back towards the input 5. If, then, the switch 9 is turned back towards the central position 10(1), nothing will change, so that the non-conducting condition of the element 1 will be maintained.

When the switch 9 is moved towards the contact 10(3), the element 1 becomes conducting. Because of the voltage drop at the resistor 8, the drain will obtain about the voltage of the source which will be fed-back again by means of the resistor 6 towards the input 5. If, now, the switch is turned back towards the central position again, this condition will be maintained so that the element 1 remains conducting.

The advantage of such a memory unit is that it latches itself after being set by means of a short switching pulse so that no refereshing of such a unit is required. This leads, in particular in large memories, to a substantial simplification of the circuit structure since no refreshing circuits are required, and also switching by means of short pulses can often be favourable.

With ordinary field-effect transistors such a switching mode is not possible since the gate voltage, as mentioned above, is opposite to that of the elements of FIG. 1, so that the feed-back according to FIG. 2 cannot be obtained then.

An other very favourable application of the elements 1 of FIG. 1 is shown in FIG. 3, in which the circuit shown forms a trivalent memory circuit. By means of a plurality of such circuits a ternary computer network can be formed.

The circuit of FIG. 3 consists of a combination of the circuits of FIGS. 2A and 2B. Both elements $1a$ (N) and $1b$ (P) are interconnected at their drain terminals $3a$ and $3b$ resp., and the source terminals $2a$ and $2b$ resp. are connected with the positive or negative pole resp. of the supply source. The elements $1a$ and $1b$ each constitute the load resistor 8 of FIG. 2 of the other one, and the feed-back resistors $6a$ and $6b$ have been combined to one single feed-back resistor 6 which is connected with a single input terminal 5; also the output terminal 7 is a single one. If the input voltage is 0, i.e. half-way between the positive and the negative supply voltages, both elements $1a$ and $1b$ are non-conducting; then the output voltage at the terminal 7 is 0. If the input voltage is positive, the element $1a$ is conducting and the element $1b$ is non-conducting, whereas at a negative input voltage the element $1a$ is non-conducting and the element $1b$ is conducting. The output voltage is, then, positive or negative respectively. The three different input voltages +, 0 and − provide, therefore, three corresponding output voltages +, 0 and − resp.

An important advantage is that both elements $1a$ and $1b$ are never conducting simultaneously, so that, in this simple series connection without additional safety measures the current source will never be short-circuited. The advantage of the memory units of being self-latching is also present here, so that only short switching pulses can be used. Thereby all kinds of active and passive couplings can be applied in principle, which will provide a maximum of flexibility when designing a circuit.

The advantage of a ternary computing unit is that, at an equal computing effect, a substantially lower number of circuits is required than when using binary units. This advantage will, however, be lost if a ternary unit would have a more complex structure and/or would consume more current. The unit shown in FIG. 3, however, is very simple in structure and, moreover, consumes very little current since always not more than one element 1 will be conducting and, then, consumes relatively little current, and switching can take place substantially at zero current.

Since in the 0-condition the terminals 5 and 7 are more or less floating, it can be sensible to fix the zero voltage thereof unambiguously. In FIG. 4 an auxiliary circuit is shown which, again, is assembled from two elements 1a and 1b of FIG. 1, and is to be connected to the input and the output of the circuit of FIG. 3 for fixing the zero voltage.

This auxiliary circuit comprises two elements 1a' (N) and 1b' (P) in series, but now the series connection is opposite to that of FIG. 3 since the source 2a' of the N-type 1a' is connected with the drain 3b' of the P-type element 1b'. The drain 3a' of the element 1a' is directly connected with the output terminal 7, and the source 2b' of the element 1b' is connected with a true zero voltage, here indicated by the ground symbol. The gate terminal 4a' of the element 1a' is connected with the input 5, and the gate terminal 4b' of the element 1b' is connected with the connecting point of the terminals 2a' and 3b'.

In such an arrangement of both elements 1a' and 1b' both will never be conducting simultaneously. In the case of a voltage of about 0 at the input 5, both elements 1a' and 1b' will be conducting, so that, then, also the ouput 7 will be unambiguously at the zero voltage. At a substantial deviation, i.e. at a positive or negative input signal, one of both elements will become non-conducting so that, then, the output 7 can assume, in the manner described above, the voltage at the input 5 which will then be maintained until being switched over.

It will be clear that the auxiliary circuit of FIG. 4 can be assembled in other manners by means of the elements of FIG. 1, provided that the condition is satisfied that at a control voltage 0 the output 7 is unambiguously maintained at the zero voltage.

As follows from the foregoing description, the output voltage, at a suitable connection of the element of FIG. 1, will be in phase with the input voltage. Thus, when being used as an amplification element, the characteristic curves as shown in a simplified manner in FIG. 5, will be obtained, and therein, as usual, in the left-hand portion the voltage difference $U_{42}$ between the gate terminal 4 and the source terminal 2 is plotted along the horizontal axis, and the drain current $I_3$ along the vertical axis, whereas in the right-hand portion the drain-source voltage $U_{32}$ is plotted along the horizontal axis. Therein no polarities are indicated, which are, in the N-type element, opposite to those in the P-type element, but the shape of the characteristic curves will be the same in both cases.

Such an amplifier circuit has the advantage that the input and output voltages are in phase, and the resistance characteristic is negative. This is very advantageous for many purposes, which needs not to be elucidated in detail.

As mentioned already in the foregoing, the elements 1a and 1b of FIG. 1 show the behaviour of a field-effect transistor, but the mentioned characteristics cannot be obtained as yet with the usual field-effect transistors. It is feasible as such that such field-efffect transistors can be realised, but this will, of course, still require much research.

However it is possible to assemble in a very simple manner the elements of FIG. 1 by means of only two field-effect transistors available at present. As these field-effect transistors all field-effect transistors can be used which operate as a junction field-effect transistor of the depletion type, in which, in the conducting state of the transistor, there is substantially no voltage difference between all the electrodes. In the non-conducting state a negative voltage is present in an n-channel transistor between the gate and source electrodes, and a positive voltage between the drain and source electrodes. In a p-channel transistor the polarities of these voltages are opposite. In the following description such semiconductors will be called n-type and p-type transistors resp.

Figure 6B:
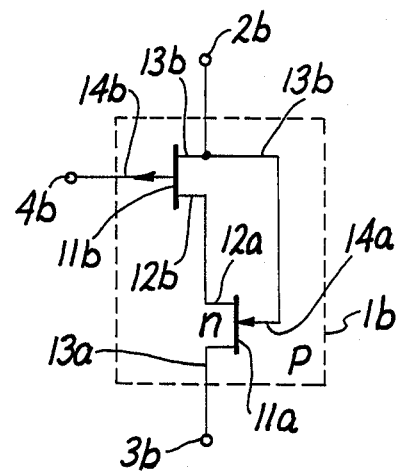

In FIGS. 6A and 6B this is indicated for an N-type element 1a and a P-type element 1b resp. Both consist of an n-type and a p-type field-effect transistor 11a and 11b resp., the source, drain and gate electrodes thereof being indicated by 12, 13 and 14 resp., followed by a in the case of an n-type transistor, and by b in the case of a p-type transistor.

As follows from FIG. 6, in each element 1 a transistor 11a is connected in series with a transistor 11b, the source electrodes 12a and 12b thereof being interconnected. The drain electrodes 13a or 13b resp. of the n-type or p-type transistor 11a or 11b resp. forms the source terminal 2a or 2b of the N-type or P-type element 1a or 1b resp. The gate electrodes 14a or 14b resp. of the transistor 11a in the case of the element 1a, or of the transistor 11b in the case of the element 1b, constitutes the control input 4a or 4b resp. of the element in question. The gate electrode 14 of the other transistor, i.e. 11b of the element 1a and 11a of the element 1b, is connected with the electrode 13 of the other transistor, the drain electrode 13 of the latter transistor also constituting the drain terminal 3 of the element in question.

In the conducting state all the voltages at all the electrodes are equal. In the non-conducting state a voltage at the electrodes 12 of the transistors is developed by voltage dicision which is about half the voltage difference between the terminals 2 and 3 of said element. Since in the non-conducting state the voltages at the terminals 4 and 3 are substanstially equal, a voltage difference between the gate terminal 4 of the element and the source electrodes 12 of the transistors is developed on the one hand, and, on the other hand, an equal but opposite voltage difference between the gate terminal 4b of the N-type element or 14a of the P-type element and the source electrodes 12 of the transistors. These transistors are chosen so that this voltage difference is sufficient for keeping the individual transistors completely non-conducting.

It will be clear that in such a circuit arrangement of two transistors all the requirements imposed on the elements 1 are fully satisfied. With this simple series connection of only two field-effect transistors the elements of FIG. 1 can, therefore, be simulated, so that all the circuits described by reference to FIGS. 2–4 can be assembled in a very simple manner. This simple series connection will, of course, allow circuit integration.

It will, furthermore, be clear that the resistance values of the resistors shown in FIGS. 2 and 3 are to be chosen so that the desired switching operation will be obtained, which, of course also holds for obtaining the characteristic curves of FIG. 5. If required said resistors can be bridged by capacitors if this is desired in view of the switching speed.

Moreover the trivalent circuit of FIG. 3 can be used as a bivalent one by applying the zero voltage at one of the current terminals 2a or 2b, in which case the input signal can have only the values zero or the other source voltage respectively. The advantage is that one element acts as the load resistor for the other one if the latter is conducting. Substantially no current will flow then, so that very little power is consumed. The output impedance is, then the same in both switching conditions.

I claim:

1. A field effect circuit element having an N-type or a P-type configuration and having source and drain terminals for connection to the poles of a current source through an intermediate load, and a gate terminal for connection to a control signal source, said source terminal to be connected to the positive pole of said current source in the case of an N-type configuration, or to the negative pole in the case of a P-type configuration characterized in that said circuit element is non-conductive while said gate terminal is at the voltage of said pole connected to said drain terminal.

2. The element of claim 1 further comprising load means connecting said drain terminal with said current source pole and feed-back means connecting said drain terminal with said gate terminal, such that the voltage fed-back to said gate remains equal to a control voltage after removal of the control voltage from said gate terminal, whereby said element is useful as a memory circuit.

3. The circuit element of claim 1 characterized in that said element is operable as an analog amplifier with negative resistance characteristics.

4. A circuit comprising an N-type and a P-type field-effect semi-conductor element;

each said element having source and drain terminals for connection to the poles of a current source through an intermediate load, and a gate terminal for connection to a control signal source, said source terminal to be connected to the positive pole of said current source in the case said N-type element, or to the negative pole in the case of said P-type element, characterized in that said element is non-conductive while said gate terminal is at the voltage of said pole connected to said drain terminal;

said elements having their gate terminals connected with a common input terminal, and both drain terminals are connected with a common output and with one end of a common feed-back resistor, said resistor at its other end being connected with a common input, such that said elements never conduct simultaneously, whereby said circuit is operable as a trivalent switching circuit, when said terminals are connected between the positive and negative poles of a current source respectively, by producing in response to an input signal that can be positive, negative or zero, an output voltage which substantially corresponds to the voltage of the positive or negative source pole or the intermediary zero voltage value respectively.

5. The circuit element of claim 4 characterized in that bivalent circuit operation may be obtained by supplying a zero voltage to one of said source terminals.

6. The circuit of claim 2 further comprising auxiliary circuit means for fixing the zero voltage level, said auxiliary circuit means consisting of two cicuit elements according to claim 1 connected in series between said output terminal and a zero-voltage terminal, the gate terminal of one of these elements being connected with the input terminal, and the gate terminal of the other of these elements with the connection between the two elements, said series connection being such that both element will conduct simultaneously only if the input voltage is zero.

7. The circuit element of any one of the claims 1 through 6 wherein each said circuit element comprises an n-type and a p-type field-effect transistor, said transistors having interconnected source electrodes, and wherein, in said N-type configuration the gate electrode of the n-type transistor forms said gate terminal, its drain electrode forms said source terminal of said element, and the gate electrode of the p-type transistor is connected with the drain electrode of the n-type transistor, the drain electrode of said p-type transistor forming said drain terminal of said elements and wherein, in said p-type configuration the gate electrode of a p-type transistor forms said source terminal of said element, and the gate electrode of the n-type transistor is connected with the drain electrode of the p-type transistor, the drain electrode of the n-type transistor forming said drain terminal of said element.

8. An electronic circuit having a gate terminal, source terminal and a drain terminal, said circuit comprising an n-type and a p-type field-effect transistor connected in an N-type or a P-type configuration, said transistors having interconnected source electrodes, and wherein, in said N-type configuration the gate electrode of the n-type transistor forms said gate terminal, its drain electrode forms said source terminal, and the gate electrode of the p-type transistor is connected with the drain electrode of the n-type transistor, and wherein, in said P-type configuration the gate electrode of a p-type transistor forms said gate terminal, the gate electrode of the n-type transistor is connected with the drain electrode of the p-type transistor, and its drain electrode forms said drain terminal.

* * * * *